(12) United States Patent
Caletka et al.

(10) Patent No.: US 7,348,261 B2
(45) Date of Patent: Mar. 25, 2008

(54) WAFER SCALE THIN FILM PACKAGE

(75) Inventors: David Vincent Caletka, Apalachin, NY (US); Seungbae Park, Fishkill, NY (US); Sanjeev Balwant Sathe, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/438,947

(22) Filed: May 15, 2003

(65) Prior Publication Data

US 2003/0199121 A1    Oct. 23, 2003

Related U.S. Application Data

(62) Division of application No. 09/626,904, filed on Jul. 27, 2000, now Pat. No. 6,627,998.

(51) Int. Cl.
  H01L 21/30    (2006.01)
  H01L 21/46    (2006.01)
  H01L 21/469   (2006.01)

(52) U.S. Cl. ............ 438/459; 438/464; 438/690; 438/759; 438/940; 438/977

(58) Field of Classification Search ........ 438/459, 438/464, 690, 759, 940, 977, FOR. 405, 438/FOR. 485
See application file for complete search history.

(56) References Cited

U.S. PATENT DOCUMENTS

| 4,617,730 | A |   | 10/1986 | Geldermans et al. | .......... 29/843 |
| 4,812,191 | A | * | 3/1989  | Ho et al.         | .......... 156/239 |
| 4,926,549 | A | * | 5/1990  | Yoshizawa et al.  | .......... 29/876 |
| 4,954,878 | A |   | 9/1990  | Fox et al.        | .......... 357/81 |
| 5,010,038 | A |   | 4/1991  | Fox et al.        | .......... 437/215 |
| 5,023,205 | A | * | 6/1991  | Reche             | .......... 216/18 |
| 5,034,091 | A | * | 7/1991  | Trask et al.      | .......... 216/18 |
| 5,055,907 | A | * | 10/1991 | Jacobs            | .......... 257/773 |
| 5,086,558 | A |   | 2/1992  | Grube et al.      | .......... 29/832 |
| 5,147,084 | A | * | 9/1992  | Behun et al.      | .......... 228/56.3 |

(Continued)

FOREIGN PATENT DOCUMENTS

EP    478426 A1 *    4/1992

*Primary Examiner*—David E Graybill
(74) *Attorney, Agent, or Firm*—John A. Jordan; William H. Steinberg

(57) ABSTRACT

A chip module having a chip with a flexible multilayer redistribution thin film attached thereto for connection to a substrate. The thin film acts as both a redistribution medium with multiple layers of redistribution metallurgy for chip power and signals and as a compliant medium to relieve stresses caused by thermal expansion mismatch between chip and substrate. Modules comprising chip and thin film may be fabricated at the chip or wafer level. The upper surface of the thin film has an array of pads matching the array of pads on the chip or wafer while the lower surface has pads matching those of the substrate. The multilayer thin film is first formed on a temporary substrate and then the chip is attached to the thin film before release from the temporary substrate. After release, the module is ready for mounting to the second level packaging substrate, such as a chip carrier or PCB. Where the multilayer thin film is formed directly on a wafer, the wafer is then diced to form the module.

6 Claims, 3 Drawing Sheets

U.S. PATENT DOCUMENTS

| | | | | |
|---|---|---|---|---|
| 5,151,388 A * | 9/1992 | Bakhit et al. | | 29/593 |
| 5,192,716 A * | 3/1993 | Jacobs | | 29/832 |
| 5,256,562 A * | 10/1993 | Vu et al. | | 438/28 |
| 5,258,236 A * | 11/1993 | Arjavalingam et al. | | 428/626 |
| 5,262,351 A * | 11/1993 | Bureau et al. | | 257/81 |
| 5,274,912 A * | 1/1994 | Olenick et al. | | 29/830 |
| 5,311,404 A * | 5/1994 | Trask et al. | | 361/762 |
| 5,329,695 A * | 7/1994 | Traskos et al. | | 29/830 |
| 5,366,794 A * | 11/1994 | Nakao | | 428/209 |
| 5,411,918 A * | 5/1995 | Keible et al. | | 257/737 |
| 5,412,539 A * | 5/1995 | Elwell et al. | | 361/792 |
| 5,422,514 A * | 6/1995 | Griswold et al. | | 257/679 |
| 5,426,072 A | 6/1995 | Finnila | | 437/208 |
| 5,444,811 A * | 8/1995 | Yoshimura et al. | | 385/141 |
| 5,447,264 A | 9/1995 | Koopman et al. | | 28/563 |
| 5,455,202 A * | 10/1995 | Malloy et al. | | 438/118 |
| 5,468,681 A | 11/1995 | Pasch | | 437/183 |
| 5,504,035 A | 4/1996 | Rostoker et al. | | 437/182 |
| 5,514,613 A * | 5/1996 | Santadrea et al. | | 438/15 |
| 5,527,741 A * | 6/1996 | Cole et al. | | 438/107 |
| 5,534,094 A * | 7/1996 | Arjavalingam et al. | | 156/155 |
| 5,534,466 A * | 7/1996 | Perfecto et al. | | 216/20 |
| 5,591,678 A * | 1/1997 | Bendik et al. | | 438/459 |
| 5,639,989 A * | 6/1997 | Higgins, III | | 174/386 |
| 5,654,590 A * | 8/1997 | Kuramochi | | 257/778 |
| 5,667,884 A * | 9/1997 | Bolger | | 428/323 |
| 5,691,245 A * | 11/1997 | Bakhit et al. | | 216/20 |
| 5,731,047 A * | 3/1998 | Noddin | | 427/555 |
| 5,786,628 A * | 7/1998 | Beilstein, Jr. et al. | | 257/684 |
| 5,796,164 A * | 8/1998 | McGraw et al. | | 257/723 |
| 5,817,541 A * | 10/1998 | Averkiou et al. | | 438/107 |
| 5,821,624 A | 10/1998 | Pasch | | 257/776 |
| 5,831,333 A * | 11/1998 | Malladi et al. | | 257/12 |
| 5,834,335 A * | 11/1998 | Buschbom | | 438/107 |
| 5,841,075 A * | 11/1998 | Hanson | | 174/250 |
| 5,841,102 A * | 11/1998 | Noddin | | 219/121.71 |
| 5,854,868 A * | 12/1998 | Yoshimura et al. | | 385/50 |
| 5,861,322 A * | 1/1999 | Caillat et al. | | 438/107 |
| 5,863,446 A * | 1/1999 | Hanson | | 216/16 |
| 5,866,949 A | 2/1999 | Schueller | | 257/778 |
| 5,868,950 A * | 2/1999 | Noddin | | 216/18 |
| 5,877,034 A * | 3/1999 | Ramm et al. | | 438/15 |
| 5,909,009 A * | 6/1999 | Tanaka | | 174/255 |
| 5,910,255 A * | 6/1999 | Noddin | | 216/18 |
| 5,915,169 A | 6/1999 | Heo | | 438/118 |
| 5,951,305 A * | 9/1999 | Haba | | 439/70 |
| 5,965,043 A * | 10/1999 | Noddin et al. | | 219/121.71 |
| 5,998,291 A * | 12/1999 | Bakhit et al. | | 438/618 |
| 5,998,859 A * | 12/1999 | Griswold et al. | | 257/679 |
| 6,018,196 A * | 1/2000 | Noddin | | 257/777 |
| 6,020,220 A | 2/2000 | Gilleo et al. | | 438/119 |
| 6,021,564 A * | 2/2000 | Hanson | | 29/852 |
| 6,023,041 A * | 2/2000 | Noddin | | 219/121.71 |
| 6,036,809 A * | 3/2000 | Kelly et al. | | 156/247 |
| 6,090,633 A * | 7/2000 | Yu et al. | | 438/15 |
| 6,103,992 A * | 8/2000 | Noddin | | 219/121.71 |
| 6,114,187 A * | 9/2000 | Hayes | | 438/106 |
| 6,126,455 A * | 10/2000 | Haba | | 439/70 |
| 6,130,015 A * | 10/2000 | Noddin et al. | | 430/22 |
| 6,132,853 A * | 10/2000 | Noddin | | 428/209 |
| 6,137,475 A * | 10/2000 | Ginn et al. | | 345/161 |
| 6,143,117 A * | 11/2000 | Kelly et al. | | 156/233 |
| 6,143,401 A * | 11/2000 | Fischer et al. | | 428/322.7 |
| 6,163,957 A * | 12/2000 | Jiang et al. | | 29/852 |
| 6,178,093 B1 * | 1/2001 | Bhatt et al. | | 361/795 |
| 6,183,588 B1 * | 2/2001 | Kelly et al. | | 156/247 |
| 6,203,891 B1 * | 3/2001 | Noddin | | 428/209 |
| 6,222,212 B1 * | 4/2001 | Lee et al. | | 257/207 |
| 6,294,407 B1 * | 9/2001 | Jacobs | | 438/118 |
| 6,322,903 B1 * | 11/2001 | Siniaguine et al. | | 428/617 |
| 6,332,569 B1 * | 12/2001 | Cordes et al. | | 228/254 |
| 6,343,171 B1 * | 1/2002 | Yoshimura et al. | | 385/50 |
| 6,375,329 B1 * | 4/2002 | Yokoyama et al. | | 353/31 |
| 6,399,178 B1 * | 6/2002 | Chung | | 428/131 |
| 6,518,093 B1 * | 2/2003 | Nakamikawa | | 438/108 |
| 6,603,202 B2 * | 8/2003 | Sasaki et al. | | 257/701 |
| 6,611,635 B1 * | 8/2003 | Yoshimura et al. | | 385/14 |
| 6,678,167 B1 * | 1/2004 | Degani et al. | | 361/760 |
| 6,690,845 B1 * | 2/2004 | Yoshimura et al. | | 385/14 |
| 6,845,184 B1 * | 1/2005 | Yoshimura et al. | | 385/14 |
| 2002/0106832 A1* | 8/2002 | Hotchkiss et al. | | 438/108 |
| 2003/0038378 A1* | 2/2003 | Jacobs | | 257/783 |
| 2004/0059552 A1* | 3/2004 | Ross | | 702/2 |

\* cited by examiner

WAFER SCALE THIN FILM PACKAGE

This is a divisional application of prior application Ser. No., 09/626,904 filed Jul. 27, 2000 now U.S. Pat. No. 6,627,998.

BACKGROUND OF THE INVENTION

1. Field of the Invention

The present invention relates to electronic packaging and methods of fabricating same. More particularly, the present invention relates to semiconductor chip packaging using a multilayer thin film for chip attachment to a substrate.

2. Background and Related Art

Ever increasing industry demand for smaller and smaller electronic packages with low profile, higher area density and increasing number of input/output connections (I/Os) has led to increasing demand for the Chip Scale Package (CSP). Use of such packages may be found in small portable products, such as cellular phones, pagers, and the like. However, it is known that CSPs have somewhat limited applications because of the limited number of I/Os due to solder interconnect reliability constraints. As feature sizes of the semiconductor chip packages decrease, as in the case of CSPs, and the I/O connection count increases, so too will the number of chips packaged in a given area. This will increase the heat dissipated by each of the chips which will, in turn, increase the thermal mismatch stresses between chip and substrate, the latter of which will decrease the interconnect reliability of the package. Various efforts have been made in the prior art to address the thermal mismatch problem. In addition, various efforts have been made to improve interconnect reliability and reduce cost by, for example, fabricating CSPs at the wafer level. However, these efforts have not been totally successful and have involved relatively complex and costly assemblies with limited capability.

In view of the limitations of prior art chip packaging mentioned hereinabove, there continues a need for a relatively simple, low profile, high density, chip packaging approach which has high interconnect reliability and high I/O connection count, and which may use relatively low-cost wafer scale processing.

SUMMARY OF THE INVENTION

In accordance with the principles of the present invention, a relatively simple chip packaging approach is provided using multilayer thin film technology. The flexible thin film acts as both a redistribution layer and a stress relief layer between chip and second level interconnect substrate. More particularly, the flexible multilayer thin film acts to provide multiple layers of redistribution metallurgy for both power and signals in the X-Y plane (e.g. fanout or grid change) and also provides sufficient flexibility to connections in both the Z-direction and X-Y plane to relieve stresses caused by the thermal expansion mismatch between semiconductor chip and second level interconnect substrate, such as, a PCB.

The flexible multilayer thin film is first mounted on either a silicon die or wafer. The upper surface of the thin film has an array of pads matching the array of pads on the die or wafer while the lower surface has pads matching those of the second level interconnect substrate. The mounting of the multilayer thin film on a die creates a module for mounting to the second level substrate, such as a chip carrier or PCB. Where the multilayer thin film is formed directly on a wafer, the wafer is then diced to form the modules.

Accordingly, it is an object of the present invention to provide an improved semiconductor chip package and method for making same.

It is a further object of the present invention to provide a chip package having a flexible multilayer redistribution thin film attached thereto to form a low profile, low vertical inductance, module.

It is yet a further object of the present invention to provide a chip module comprising a flexible multilayer thin film attached to the chip which thin film acts as both a redistribution medium and stress relief medium between chip and next level of packaging.

It is another object of the present invention to provide a chip module formed by fabricating a flexible multilayer redistribution thin film on a wafer before dicing.

It is yet another object of the present invention to provide a chip package and method of making same which acts to increase interconnection reliability and I/O count and provide simple, low cost, assembly.

These foregoing and other objects, features and advantages of the invention will be apparent from the following more particular description of a preferred embodiment of the invention, as illustrated in the accompanying drawings, wherein like reference members represent like parts of the invention.

BRIEF DESCRIPTION OF THE DRAWINGS

FIG. 3b shows an exploded view of a portion of the chip package shown in FIG. 3a.

FIG. 4 shows a cross-sectional view of an alternative embodiment of the chip package shown in FIG. 3a.

FIG. 6b shows a cross-section of the thin-film-on-wafer of FIG. 6a.

DETAILED DESCRIPTION

Figure 1:
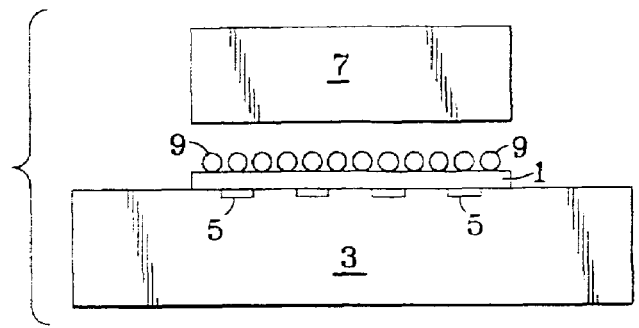
FIG. 1 shows a cross-section of a partially assembled chip module, made in accordance with the present invention.

With reference to FIG. 1, there is shown a cross-sectional view of a partially assembled chip module which view is used to facilitate a description of the process for creating the flexible multilayer redistribution thin film and attaching to a chip, in accordance with the present invention. Multilayer thin film 1 is first formed upon master glass substrate 3. The thin film may be formed by any of a variety of thin film lithography techniques known to those skilled in the art.

Fabrication of the thin film structure using conventional lithographic processing steps necessarily begins with selecting a flat, rigid substrate to ensure good feature resolution. For ease of removal of the thin film after completion of its formation, glass has been selected. To reduce thermal expansion mismatch between the chip and glass substrate 3, a borosilicate glass with a CTE similar to silicon is selected, such as that sold under the Trademark BOROFLOAT. The glass surface for deposit may first be cleaned and then a thin release layer 8 microns thick is deposited. The release layer (not shown) is typically the same material as is used to form the thin film structure and may be deposited by spinning onto glass substrate 3. For example, a polymer, such as, polyimide may be used. The polymer release layer is then properly cured. Pads 5 may then be formed on the substrate or, alternatively, formed after the module is completed. Where pads 5 are formed at this point, they are formed in a pattern matching the pattern of the second level package to which it is to be attached. The pads may be BGA pads, for example, formed by sputtering or electroplating, for example, 10-20 microns of metal, such as copper.

A first layer of polyimide or other polymer, such as, a filled PTFE, or a polymer material sold under the trademark [Teflon®, Teflon® is a registered trademark of E.I. du Pont de Nemours & Company)] TEFLON, 10-11 microns thick is then spun onto the release layer with or without pads, depending upon process choice. A pattern of vias selected according to the pattern of pads formed on the glass substrate matching the pads on the second level package to which it will be attached, is then ablated by laser ablation into the first layer of polyimide. The vias are then filled with conductive material to the underlying pads. This may be done by electroplating copper to the copper pads or filling with an electrically conductive adhesive. It is clear that other metals may also be used instead of copper. Where pads have not yet been formed, the vias may be electrolessly plated with copper.

A layer of copper is then deposited on the first layer of polyimide and in contact with the conductively filled vias. The layer of copper may be 5-6 microns thick and can be electroplated. The layer of copper is then masked with a layer of resist according to the selected metallurgical pattern of the overall redistribution pattern to leave copper lines contacting selected vias. The layer of copper is then etched, for example, by reactive ion etching. Then a second layer of polyimide is deposited upon the first layer of polyimide and copper lines. A pattern of vias is then ablated into the second layer of polyimide at selected locations to the underlying copper lines and the vias are plated with copper. Another layer of copper is then deposited upon the second layer of polyimide and copper plated vias. The second layer of copper is etched according to the desired metallurgical pattern and the process repeats until the overall redistribution pattern is achieved.

When the final layer of polyimide is formed, the pattern of metal filled vias is selected to match the pattern of conductive pads (not shown) on chip 7. Pads are then formed on these vias. Such pad may be, for example, C4 pads. FIG. 3*b* shows a typical 3 level redistribution thin film. It is clear that any desired number of layers of polyimide and metal may be employed, depending upon the complexity of the redistribution pattern. It is also clear that any of a variety of deposition and etching techniques may be employed to form the layers of material, vias and metallurgical patterns.

Again, with reference to FIG. 1, after forming the multilayer redistribution thin film on substrate 3 with a pattern of C4 pads on its top surface matching the pattern of pads on chip 7, high melt C4 solder balls 9, for example, are attached to the pads, as shown. Chip 7 is then positioned and attached by C4 melting of the high melt solder, as is known to those skilled in the art. Other alloy systems may also be used in place of the high melt solder, such as, eutectic SnPb, SnAgCu or SnAgBi. After attaching chip 7 to thin film 1, the chip is underfilled with any of a variety of underfills, such as an epoxy, to bond chip 7 to thin film 1. The epoxy may be with or without fillers. Examples of such epoxies are epoxies sold under the trademarks HYSOL, NAMICS [Hysol, Namics] and RCE. The underfill step may be carried out by dispensing with a dispensing needle from the edge of the chip where the epoxy will penetrate by capillary action.

After the underfill step, the resulting module comprising chip 7 and thin film 1 is separated from glass substrate 3. This may be done by laser ablation, such as, with a 308 nm excimer laser. The detached surface of the module is then cleaned by etching, and if pads have not been previously formed, to prepare for the formation of the BGA pads. These pads may be formed, for example, by ablating a pattern of recesses for the pad areas and then plating therein a 10-20 micron layer of copper, according to the underlying pattern of vias matching the second level package to which it will be connected.

Figure 2:
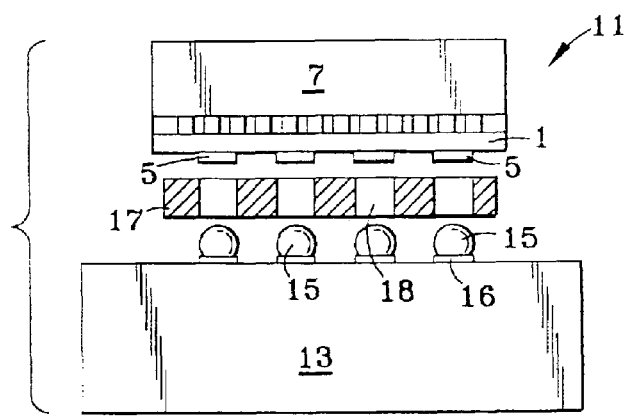
FIG. 2 shows a cross-section of a partially assembled chip package made in accordance with the present invention.

After separation from glass substrate 3, the resulting module 11 (with chip, C4-s, underfill, thin film and BGA pads) as shown in FIG. 2, is attached to a second level package, such as, PCB 13. PCB 13 is shown, for example, with an array of low temperature melt solder balls 15 matching pads 5 on module 11, as hereinabove described. Solder balls 15 are formed on BGA pads 16. As described above, other alloy systems may also be used in place of the low melt solder, such as, eutectic SnPb, SnAgCu or SnAgBi. Spacer 17 is used for alignment and reinforcement. Examples of such spacers are layers of material sold under the trademarks KAPTON or EKJ [DuPont® or Kapton®, Kapton® is a registered trademark of E.I du Pont de Nemours & Company], 150-200 microns thick punched or drilled with holes for aligning solder balls 15 to pads 5. The spacer not only acts to align but also acts to provide stress relief to the solder ball interconnections by redistributing stress due to thermal expansion mismatch. The spacer may be joined to the thin film redistribution layer and PCB by either a thermoplastic adhesive or adhesive tape. After alignment, the low temperature melt solder is heated to reflow the solder and make connection of chip module to PCB. It is clear that rather than use a spacer to align module 11 to PCB 13, module 11 may be otherwise aligned in contact with solder balls 15 and heated to form the connection, and then a reworkable underfill dispensed to support the connection.

Figure 3A:
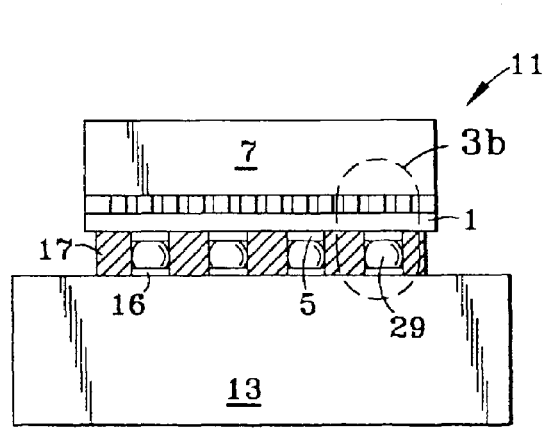
FIG. 3a shows a cross-section of an assembled chip package, made in accordance with the present invention.
Figure 3B:
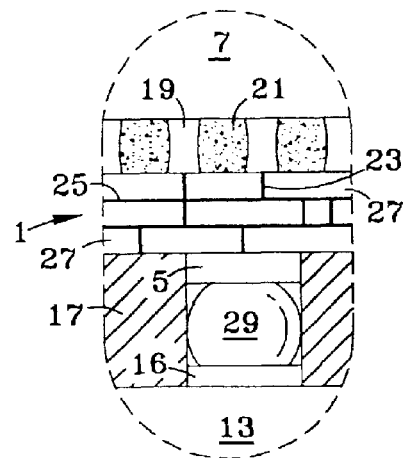

The resulting assembled package is shown in FIG. 3*a*. An expanded view of a portion of FIG. 3*a* is shown in FIG. 3*b*. C4 connections 21 in FIG. 3*b* are shown separated by underfill 19. For demonstration purposes, a 3 level thin film is shown with via filled conductors 23 and layers of metallurgy 25 between the three layers of polyimide 27. It is clear that more than 3 levels of thin film may be employed, depending upon the degree of redistribution required. Spacer 17 surrounds solder connection 29, the latter making contact with BGA pads 5 of module 11 and pads 16 of PCB 13. Although reference has been made to mounting module 11 on a PCB, it is clear that other carriers may be used, such as an organic or ceramic carrier.

Figure 4:
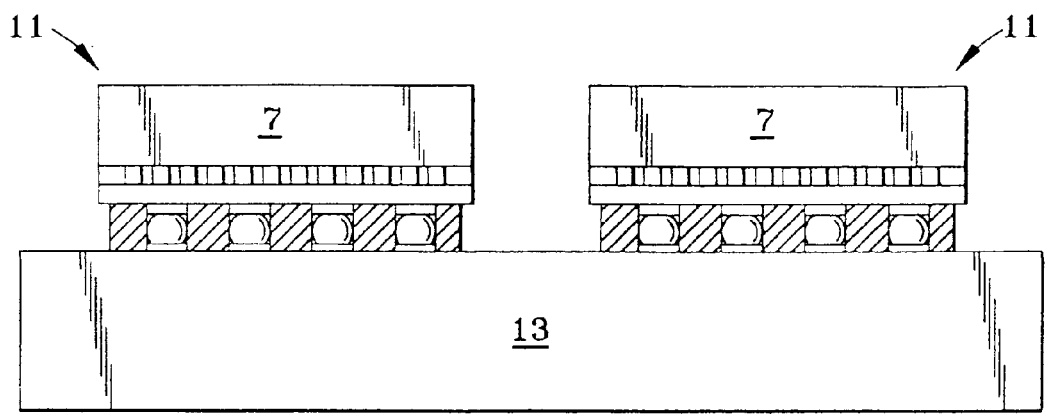

FIG. 4 shows an alternative embodiment of the chip package shown in FIG. 3*a*. As can be seen, 2 modules 11 are mounted on PCB 13. It is clear that more than 2 modules could be mounted on the PCB.

Figure 5:
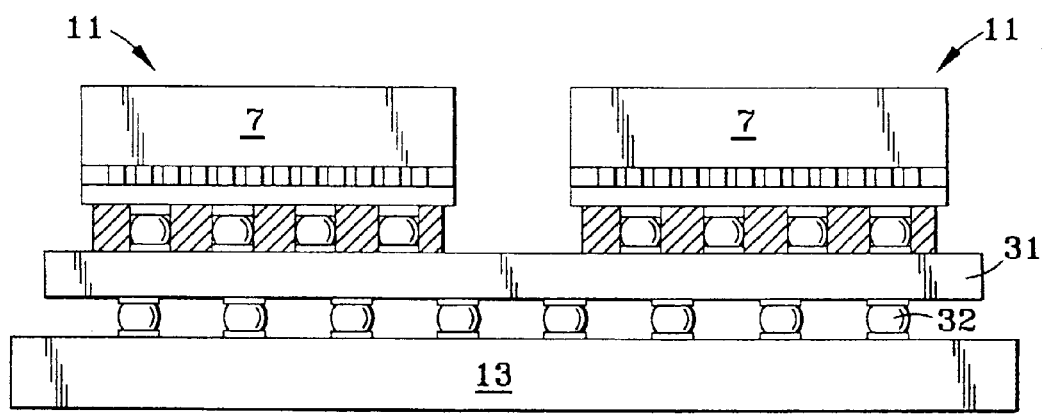
FIG. 5 shows another embodiment of the chip package in accordance with the present invention.

FIG. 5 shows a further embodiment where the carrier 31 for modules 11 is a substrate mounted on PCB 13. Carrier 31 may be an organic or ceramic carrier.

Figure 6A:
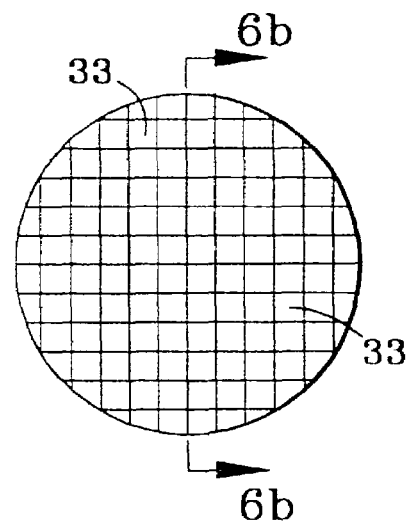
FIG. 6a shows a further embodiment wherein the flexible multilayer redistribution thin film is first fabricated on a wafer.
Figure 6B:
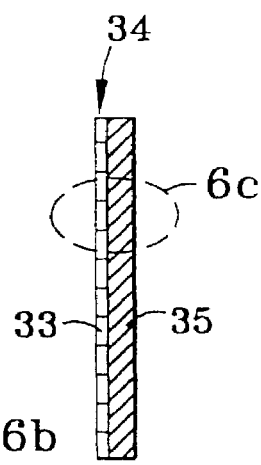
Figure 6C:
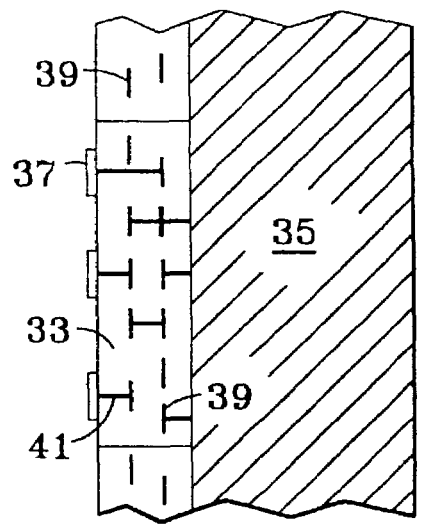
FIG. 6c shows an exploded view of the cross-section of FIG. 6b.

With reference to FIG. 6, there is shown a further embodiment wherein the flexible multilayer redistribution film is first fabricated on a wafer. FIG. 6*a* shows a front view of a wafer upon which individual chip multilayer redistribution thin film 33 patterns are formed. The individual patterns of thin film 33 for each chip are as described above, for purposes of redistribution of power and signal or grid change in the X-Y plane (parallel to the chip). FIG. 6*b* shows a cross-section of FIG. 6*a* wherein the individual chip patterns 33 of the overall thin film layer 34 are shown respectively formed directly on the array of chips of wafer 35. FIG. 6c shows an exploded view of FIG. 6b with BGA pads 37 shown on the final layer of an individual chip multilayer redistribution thin film. Metallurgical pattern 39 and vias 41, at the cross-section taken, are shown by way of example.

Fabrication of the overall multilayer thin film on wafer 35 is similar to that described above for fabrication of the chip level. However, it is clear that via, masking and etching patterns for the individual chip multilayer redistribution thin films 33 may vary, one from the other, or may be the same throughout the wafer. Fabrication directly on wafer 35 begins by spinning, for example, a layer of polyimide 10 to 11 microns thick onto the wafer covering the array of chips connection pads (not shown) on the wafer. Vias are then ablated in the polyimide to expose the array of chip connection pads. The vias are filled by electroplating, for example, to the chip pads to form conductive columns 41. Typically, copper would be plated to copper pads. Next, a layer of copper is deposited upon the layer of polyimide and copper filled vias and the process continues, as described above, to form layers of metal 39 of the multilayer metallurgical redistribution pattern. The final layer of polyimide is fabricated with a pattern of vias on the individual chip multilayer redistribution thin film matching the pattern of pads on the PCB to which it will be attached. As a final step in fabricating at the wafer level to form a wafer scale package, a pattern of BGA pads 37 is formed on the vias which pattern, then, matches the pattern of PCB pads. The wafer may then be diced using conventional dicing techniques, as is known to those skilled in the art. The resulting module, comprising chip and flexible multilayer redistribution thin film may then be attached to a carrier in the variety of way described above. It should be noted that whether the flexible multilayer redistribution thin film module is formed at the wafer level, as described with respect to FIG. 6, or at the chip level, as described with respect to FIG. 1, the resulting thin film of the module can be made, dimensionally, to an area the same size as the chip area to which it is attached.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of forming a chip module comprising:
   providing a chip having an array of conductive pads;
   providing a temporary glass substrate;
   forming conductive pads on said temporary glass substrate positioned for connection to a packaging substrate for said chip module;
   providing a flexible redistribution thin film having first and second surfaces and having multiple layers of redistribution metallurgy with said flexible redistribution thin film formed on said temporary glass substrate so that said first surface is positioned on said glass substrate with said conductive pads formed thereon and said second surface is exposed;
   forming an array of conductive pads on said exposed second surface of said flexible redistribution thin film matching the array of conductive pads on said chip;
   attaching respective ones of said array of conductive pads on said chip to respective ones of said array of conductive pads on said exposed second surface of said flexible redistribution thin film by solder ball connections so as to form an array of solder ball connections each having space between it and adjacent solder ball connections and filling said space between said solder ball connections with an epoxy before removal from said temporary substrate; and
   removing by laser ablation said flexible redistribution thin film and chip from said temporary glass substrate to thereby expose said first surface of said flexible redistribution thin film with said first surface having included thereon said conductive pads formed on said glass substrate.

2. The method as set forth in claim 1 wherein conductive pads for connection to a packaging substrate are formed on said first surface of said flexible redistribution thin film after said step of removing.

3. The method of claim 1 wherein said temporary glass substrate is a temporary borosilicate glass substrate.

4. The method as set forth in claim 1 wherein said laser in said step of removing by laser ablation is a 308 nm excimer laser.

5. The method as set forth in claim 1 wherein said thin film comprises alternate layers of polyimide and circuitry to provide both a redistribution medium for signal and power redistribution from chip to said packaging substrate and a compliant medium to provide relief to stress on electrical connections caused by thermal mismatch between chip and said packaging substrate.

6. A method of forming a chip module comprising:
   providing a chip having an array of conductive pads;
   providing a temporary glass substrate;
   forming conductive pads on said temporary glass substrate positioned for connection to a packaging substrate for said chip module;
   providing a flexible redistribution thin film having first and second surfaces separating alternate layers of polyimide and circuitry to provide both a redistribution medium for signal and power redistribution from said chip to said packaging substrate and a compliant medium for stress relief caused by thermal mismatch between said chip and said packaging substrate with said flexible redistribution thin film formed on said temporary glass substrate so that said first surface is positioned on said glass substrate with said conductive pads formed thereon and said second surface is exposed;
   forming an array of conductive pads on said exposed second surface of said flexible redistribution thin film matching the array of conductive pads on said chip;
   attaching respective ones of said array of conductive pads on said chip to respective ones of said array of conductive pads on said exposed second surface of said flexible redistribution thin film by solder ball connections so as to form an array of solder ball connections each having space between it and adjacent solder ball connections and filling said space between said solder ball connections with an epoxy before removal from said temporary substrate; and
   removing by laser ablation said flexible redistribution thin film and chip from said temporary glass substrate to thereby expose said first surface of said flexible redistribution thin film with said first surface having included thereon said conductive pads formed on said glass substrate.

* * * * *